(12) United States Patent
Landru et al.

(10) Patent No.: US 9,922,867 B2
(45) Date of Patent: Mar. 20, 2018

(54) METHOD FOR TRANSFERRING A USEFUL LAYER

(71) Applicant: Soitec, Crolles (FR)

(72) Inventors: Didier Landru, Champ Pres Froges (FR); Oleg Kononchuk, Grenoble (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/018,465

(22) Filed: Feb. 8, 2016

(65) Prior Publication Data

US 2016/0233125 A1    Aug. 11, 2016

(30) Foreign Application Priority Data

Feb. 10, 2015  (FR) ...................... 15 51046

(51) Int. Cl.
*H01L 21/324* (2006.01)
*H01L 21/762* (2006.01)
*H01L 21/265* (2006.01)

(52) U.S. Cl.
CPC .. *H01L 21/76254* (2013.01); *H01L 21/26506* (2013.01); *H01L 21/324* (2013.01)

(58) Field of Classification Search
CPC ......... H01L 21/76254; H01L 21/26506; H01L 21/324
USPC ................ 438/458, 459, 488, 455
See application file for complete search history.

(56) References Cited

U.S. PATENT DOCUMENTS

| 7,176,108 B2 | 2/2007 | Cayrefourcq et al. |
| 2006/0027459 A1* | 2/2006 | Christophersen ........ G02B 1/00 205/79 |
| 2006/0145182 A1* | 7/2006 | Fujioka .................. C30B 25/18 257/103 |
| 2008/0194084 A1* | 8/2008 | Kononchuk ...... H01L 21/76254 438/488 |
| 2010/0112782 A1* | 5/2010 | Teixeira ............... H01L 21/304 438/458 |
| 2014/0014029 A1* | 1/2014 | Faure ................ H01L 21/76254 117/88 |

FOREIGN PATENT DOCUMENTS

| EP | 2159826 A1 | 3/2010 |
| EP | 1429381 B1 | 7/2011 |

(Continued)

OTHER PUBLICATIONS

French Search Report for French Application No. 1551046, dated Nov. 25, 2015, 2 pages.

*Primary Examiner* — Moin Rahman
(74) *Attorney, Agent, or Firm* — TraskBritt (57) ABSTRACT

A method for transferring a useful layer onto a carrier substrate comprises formation of an embrittlement plane by implantation of light species into a first substrate in such a manner as to define the bounds of a useful layer between the plane and a surface of the first substrate, mounting of the carrier substrate onto a surface of the first substrate so as to form an assembly to be fractured, and thermal fracture treatment of the first substrate along the embrittlement plane in such a manner as to transfer the useful layer onto a support. During the thermal fracture treatment, the degree of peripheral adhesion is reduced at an interface between the carrier substrate and the first substrate.

18 Claims, 4 Drawing Sheets

(56) References Cited

FOREIGN PATENT DOCUMENTS

| | | |
|---|---|---|
| EP | 1045448 B1 | 4/2016 |
| WO | 2005043615 A1 | 5/2005 |
| WO | 2005043616 A1 | 5/2005 |

* cited by examiner

METHOD FOR TRANSFERRING A USEFUL LAYER

CROSS-REFERENCE TO RELATED APPLICATION

Pursuant to 35 U.S.C. § 119(a), this application claims the benefit of the filing date of French Patent Application Serial No. 1551046, filed Feb. 10, 2015, for "Method for Transferring a Useful Layer," the contents of which are incorporated herein in their entirety by this reference.

TECHNICAL FIELD

The present disclosure relates to a method for transferring a useful layer onto a carrier substrate.

BACKGROUND

Figure 1:
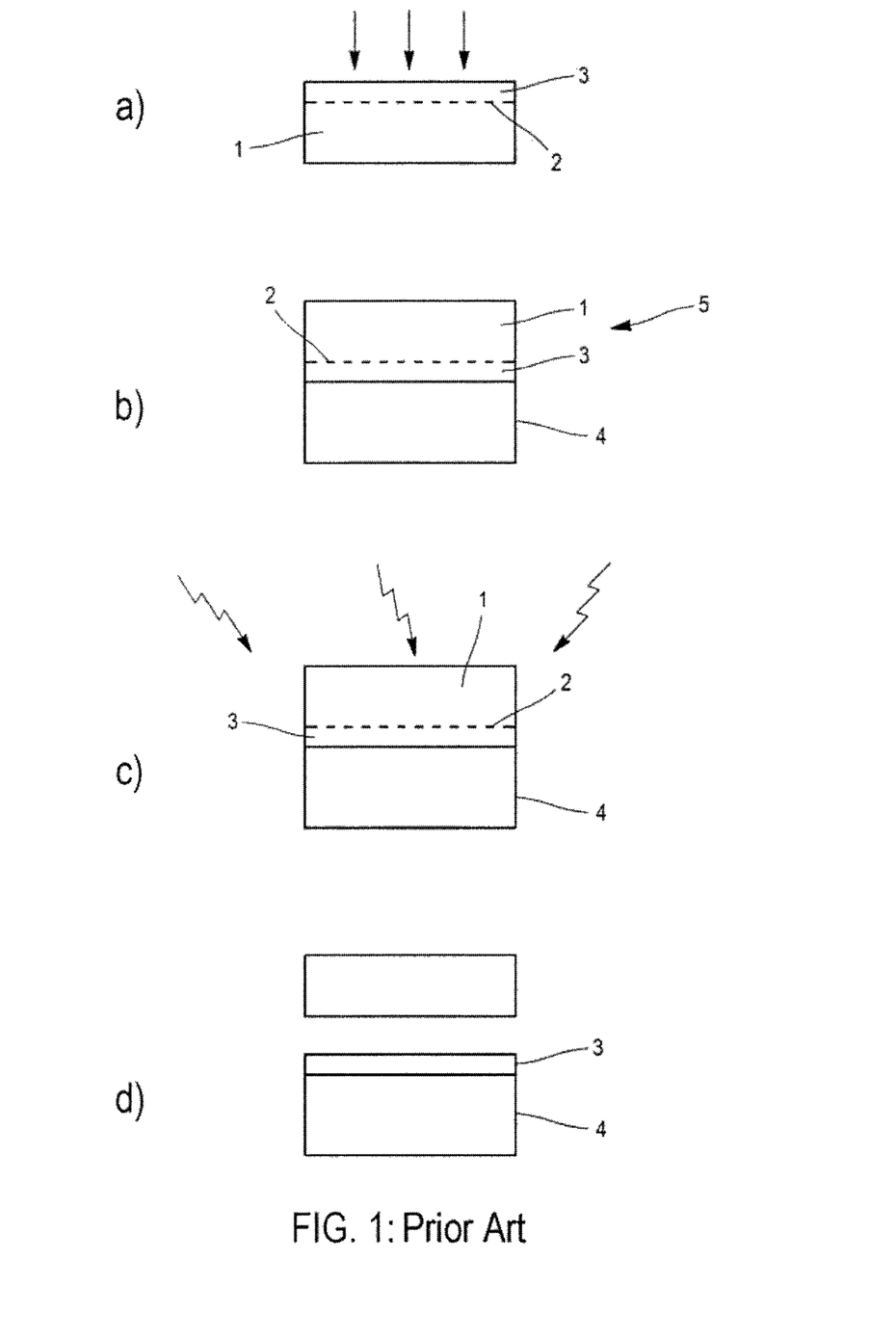
FIG. 1 shows a method for transferring a useful layer onto a carrier substrate according to the prior art.

A method is known from the prior art for transferring a useful layer 3 onto a carrier substrate 4, shown in FIG. 1, this method comprising the following main steps:

in a step a), the formation of an embrittlement plane 2 by implantation of light species into a first substrate 1 in such a manner as to define the boundaries of a useful layer 3 between the plane and a surface of the first substrate 1;

in a step b), the application of the carrier substrate 4 onto the surface of the first substrate 1 in order to form an assembly to be fractured 5;

in a step c), the thermal embrittlement treatment of the assembly to be fractured 5;

in a step d), the initiation and propagation of a fracture wave within the first substrate 1 along the embrittlement plane 2.

During this process, the implanted species lead to the development of microcavities. The thermal embrittlement treatment has the effect of promoting the growth, the coalescence and applying pressure to these microcavities. Under the effect of this thermal treatment alone, or by means of additional external forces, the initiation and the self-sustaining propagation of a fracture wave allows the useful layer 3 to be transferred by detachment in the embrittlement plane 2.

This method, notably described in the International Publications WO 2005/043615 and WO 2005/043616 and denoted by the term "SMART CUT®," is, in particular, useful for the fabrication of silicon-on-insulator substrates. In this case, the first substrate 1 and the carrier substrate 4 consist of silicon wafers, and one and/or the other of the first substrate 1 and of the carrier substrate 4 undergo surface oxidation.

The silicon-on-insulator substrates 1, 4 must comply with very precise specifications. This is particularly the case for the mean thickness and the thickness uniformity of the useful layer 3. Compliance with these specifications is required for the correct operation of the semiconductor devices that will be formed within and on this useful layer 3.

In some cases, the architecture of these semiconductor devices requires the availability of silicon-on-insulator substrates having a useful layer 3 with a very small mean thickness, for example, less than 50 nm, or even less than 10 nm, and a very constant thickness uniformity on the surface of the substrate. The expected thickness uniformity may thus be of the order of 1% at the most, corresponding to variation maxima typically going from +/−0.1 nm to +/−1 nm over the whole surface of the substrate.

It is usual, following the "SMART CUT®" method, to apply complementary steps for finishing the useful layer 3, such as etches or thermal treatments for surface smoothing, in order to try to achieve the desired specification level.

The thickness of the useful layer 3 is not perfectly uniform after the fracture step. These thickness variations may, for example, take the form of a periodic pattern whose amplitude is of the order of a nm or of half a nanometer and whose wavelength is of the order of a mm, or up to a cm. The periodic pattern may be apparent over the entirety of the useful layer 3, or only over a part. Variations in thickness may also appear within a given region of the useful layer 3, generally referred to as a "dense region," corresponding to the region of initiation of the fracture wave. The thickness variations may also arise in other ways and exhibit other characteristics.

It can be particularly difficult to sufficiently rectify the thickness non-uniformity of the useful layer 3 by the usual finishing techniques (etching, sacrificial oxidation, thermal smoothing treatment, polishing) in order to enable the required level of uniformity to be attained, when the latter is high.

It is possible to reduce the thickness non-uniformity of the useful layer 3 by trying to lower the temperature at which the initiation and the propagation of the fracture wave occur. This may be obtained, in a first approach, by lowering the temperature of the thermal embrittlement treatment step.

This approach, however, has the drawback of excessively lengthening the duration of the thermal embrittlement treatment, which is not favorable for the industrial exploitation of the method. In some cases, it turns out not to be possible to cause the initiation of the fracture, even for a very long treatment time, when the temperature of the thermal treatment is below a threshold temperature. This is notably the case for the fabrication of very thin SOI substrates, such as those previously mentioned.

Another approach, aimed at lowering the temperature at which the initiation and the propagation of the fracture wave occur, consists in causing this initiation by application of an external force, for example, a mechanical force, on the assembly to be fractured 5 situated at ambient temperature or at a moderate temperature, after the thermal treatment step, and without the latter having, in itself, caused this fracture.

However, this approach also has limitations. It requires the development of equipment dedicated to this mechanical fracture step, which can be complex and costly notably where the assembly to be fractured needs to be maintained at temperature.

In addition, this fracturing operation is likely to cause defects around the periphery of the useful layer 3 or of the carrier substrate 4, linked to the insertion of the mechanical element at the mounting interface of the assembly to be fractured 5.

Finally, this approach requires the parameters of the thermal embrittlement treatment step to be precisely controlled in order to bring the embrittlement plane into a sufficiently weakened state to enable the self-sustaining propagation of the fracture after mechanical initiation, without, however, exceeding a threshold beyond which this initiation occurs naturally in the course of the thermal treatment itself. This control is particularly tricky when the substrates are processed in batches, since each assembly of the batch to be fractured 5 can have a sensitivity to the thermal embrittlement treatment that is slightly different.

BRIEF SUMMARY

One aim of the disclosure is therefore to provide a method for transferring a useful layer onto a carrier, this useful layer having a well-controlled thickness uniformity, in which the method does not have the aforementioned drawbacks.

The disclosure is notably aimed at providing silicon-on-insulator substrates whose useful layer has a mean thickness of less than 50 nm, the useful layer exhibiting variations in thickness whose amplitude is less than 1 nm.

Another aim of the disclosure is to provide a method for transferring a useful layer onto a carrier substrate whose industrial control is facilitated.

With a view to attaining at least one of these objectives, the subject of the disclosure is a method for transferring a useful layer onto a carrier substrate comprising the following steps for:

formation of an embrittlement plane by implantation of light species into a first substrate, in such a manner as to define the boundaries of a useful layer between the embrittlement plane and a surface of the first substrate;

mounting of the carrier substrate onto the surface of the first substrate so as to form an assembly to be fractured;

thermal fracture treatment of the first substrate along the embrittlement plane in such a manner as to transfer the useful layer onto the carrier.

According to the disclosure, the method comprises, during the thermal fracture treatment step, a processing step for reduction of the degree of peripheral adhesion at an interface between the carrier substrate and the first substrate. Surprisingly, the inventors of the present application have observed that this weakening at the assembly interface allowed the initiation and the propagation of the fracture wave along the embrittlement plane to be obtained using a reduced amount of thermal energy.

According to other advantageous and non-limiting features of the disclosure, taken alone or in combination:

the thermal treatment step consists in exposing the assembly to be fractured to an atmosphere in an oven;

the first substrate and the carrier substrate comprise silicon and the temperature of the atmosphere in the oven is higher than 350° C.;

the processing for reduction of the degree of peripheral adhesion comprises the introduction of water into the atmosphere in an oven;

the implanted light species are chosen from between hydrogen ions and helium ions;

the processing for reduction of the degree of peripheral adhesion is applied to the interface at an interface between the carrier substrate and the first substrate over a radial distance greater than 1 micron, preferably in the range between 100 and 500 microns, starting from the edge of the assembly to be fractured.

The thermal fracture treatment step comprises:

a first phase at a first temperature, the first phase not leading to the initiation of the fracture, then;

a second phase at a second temperature;

the processing for reduction of the degree of peripheral adhesion being applied during the second phase;

the processing for reduction of the degree of peripheral adhesion being applied between the first and the second phase, at ambient temperature;

the second temperature being lower than the first;

the processing for reduction of the degree of peripheral adhesion comprising the exposure of the assembly to be fractured to an environment having a level of humidity higher than a given level for a period of time longer than a given period;

the processing for reduction of the degree of peripheral adhesion comprising the exposure of the assembly to be fractured to an etching environment.

BRIEF DESCRIPTION OF THE DRAWINGS

The disclosure will be better understood in the light of the description that follows of particular non-limiting embodiments of the disclosure with reference to the accompanying figures amongst which.

DETAILED DESCRIPTION

For the sake of simplification of the description hereinbelow, the same references are used for elements that are identical or that provide the same function in the various embodiments presented of the method according to the disclosure, or in the method according to the prior art.

Figure 2:
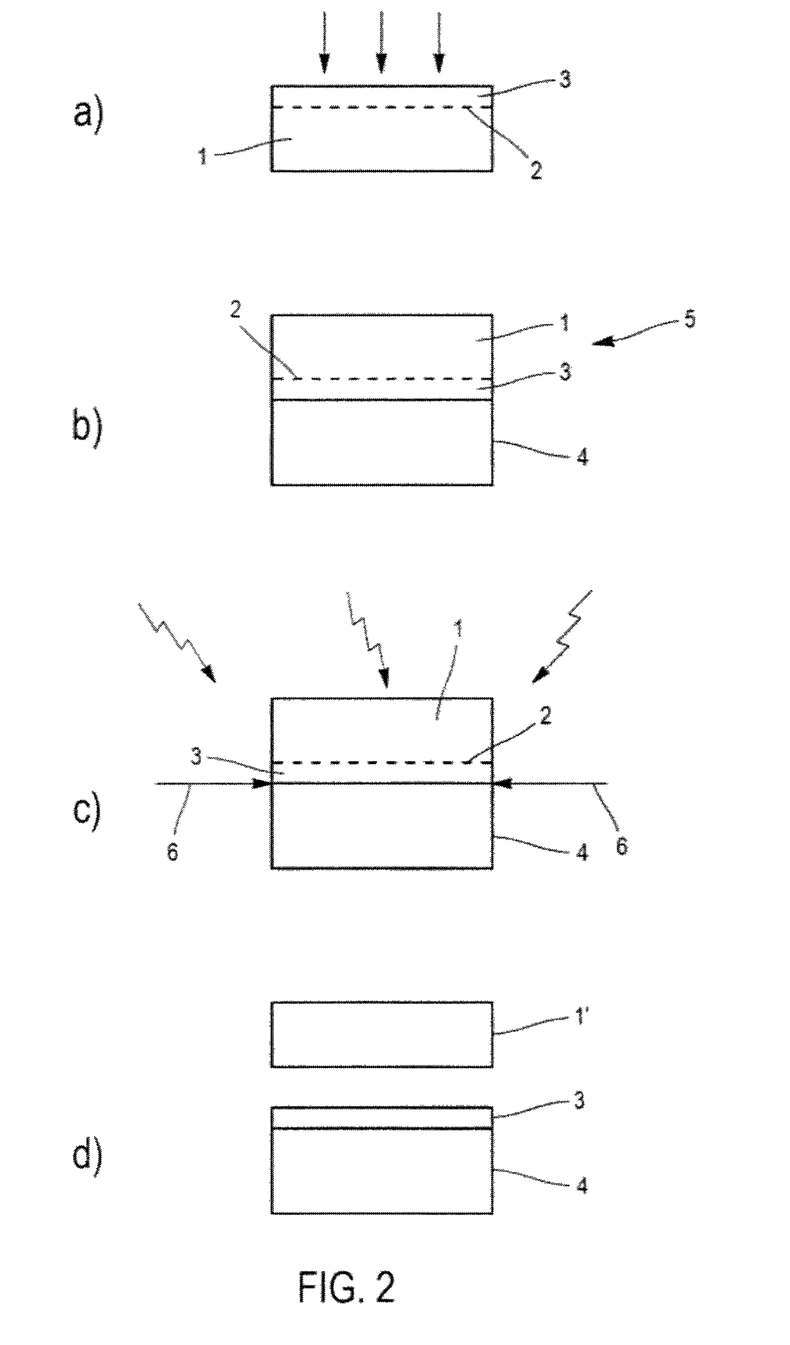
FIG. 2 shows the method according to the disclosure.

The detailed description of the method according to the disclosure is presented with reference to FIG. 2. This method transfers a useful layer 3 coming from a first substrate 1 onto a carrier substrate 4.

The first substrate 1 and the substrate 4 may be made of any given materials. This may be a semiconductor material (such as silicon, SiGe, germanium, gallium nitride), an insulator (such as sapphire or glass) or a piezoelectric material (such as lithium tantalate or lithium niobate).

The first substrate 1 and/or the carrier substrate 4 may comprise a layer of insulator comprising, for example, or being composed of, an oxide of silicon or of aluminum or a nitride of silicon or of aluminum. It may accordingly have been formed by deposition, by oxidation or by nitridation, as the case may be.

In one particular exemplary embodiment of the disclosure, the first substrate 1 and the carrier substrate 4 are silicon wafers taking the form of a disc whose diameter is typically 200 mm, 300 mm or even 450 mm. At least one of these wafers has a layer of insulator on its surface such that, accordingly, at the end of the process, a silicon-on-insulator wafer is obtained. However, the disclosure is not limited to only these materials, only this shape or only these dimensions.

The method according to the disclosure comprises a first step 2a for formation of an embrittlement plane 2 by implantation of light species into the first substrate 1 in such a manner as to form a useful layer 3 between the embrittlement plane 2 and the implanted surface of the first substrate 1.

The embrittlement plane 2 is typically formed by implantation of hydrogen and/or a noble gas. Thus, the light species may be chosen from between hydrogen and helium ions in doses in the range between 5e15 and 1e17 at/cm$^2$. As regards the energy of implantation, this is typically in the range between 10 keV and of 200 keV and defines the depth of implantation of the ions.

In a second step 2b, after the first, the carrier substrate 4 is mounted onto the implanted surface of the first substrate 1, so as to form an assembly to be fractured 5.

This assembly is preferably achieved by molecular adhesion, in other words by direct adhesion of the surfaces with each other without the addition of adhesive material (except for water), and implementing forces of adhesion principally of van der Waals type or covalent forces.

By way of example, when the first substrate 1 and the carrier substrate 4 are made of silicon and one or the other has a layer of silicon oxide on its surface (provided intentionally or otherwise) the adhesion forces are produced by van der Waals forces between the molecules of water adsorbed onto the surfaces.

The assembly step may be preceded by any given prior treatment of the surface of the substrate 1 and of the carrier substrate 4 such as cleaning, a plasma activation, etc.

In a next step 2c, the assembly to be fractured 5 is subjected to a thermal fracture treatment step. This step aims to develop microcavities, platelets and/or other types of defect precursors to the fracture within the embrittlement plane 2. This leads to the initiation and to the propagation of the fracture wave (the initiation and the propagation also being referred to as "fracture" or "initiation of the fracture" in the present application) along the embrittlement plane 2, in such a manner as to transfer the useful layer 3 onto the carrier substrate 4. In other words, the fracture is obtained, in the present disclosure, in the course of this thermal treatment and does not therefore require the application of an additional external force.

The thermal fracture treatment may also contribute to reinforcing the degree of adhesion between the first substrate 1 and the carrier substrate 4.

After this thermal fracture treatment step and as shown in FIG. 2d, are therefore obtained, on the one hand, the useful layer 3 transferred onto the carrier substrate 4, and on the other hand, a residue 1' of the first substrate 1 from where the useful layer 3 has been removed. This residue 1' may be reprocessed in order to serve as a new first substrate or as a carrier substrate in a new layer transfer cycle, or for any other use.

According to the disclosure, the method also comprises, during the thermal fracture treatment step 2c and prior to the initiation of this fracture, a processing step for reduction of the degree of peripheral adhesion between the carrier substrate 4 and the first substrate 1, represented schematically by the arrows 6 in FIG. 2c.

The object of this operation is to weaken the strength of adhesion existing between the carrier substrate 4 and the first substrate 1 over at least a part of a peripheral region, in other words on the edges of their surfaces in contact.

Figure 3A:
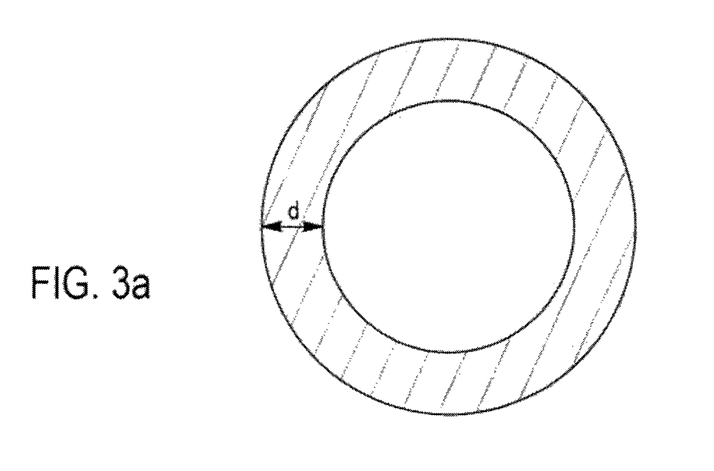
FIGS. 3a to 3c show various conditions for application of the processing according to the disclosure presented on a view of the assembly surface of the first substrate and of the carrier substrate.
Figure 3B:
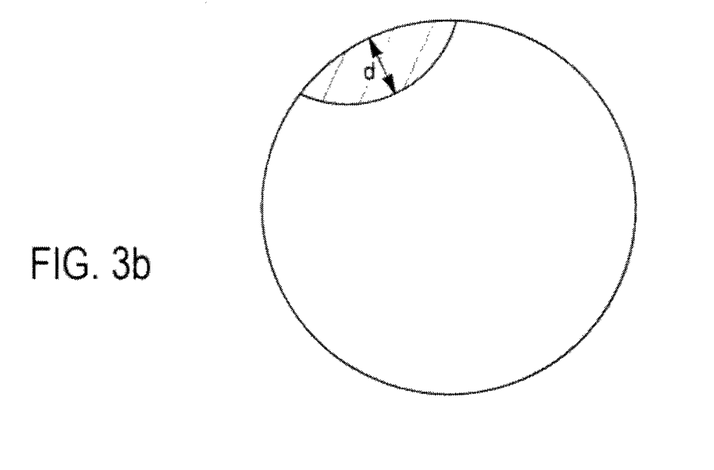
Figure 3C:
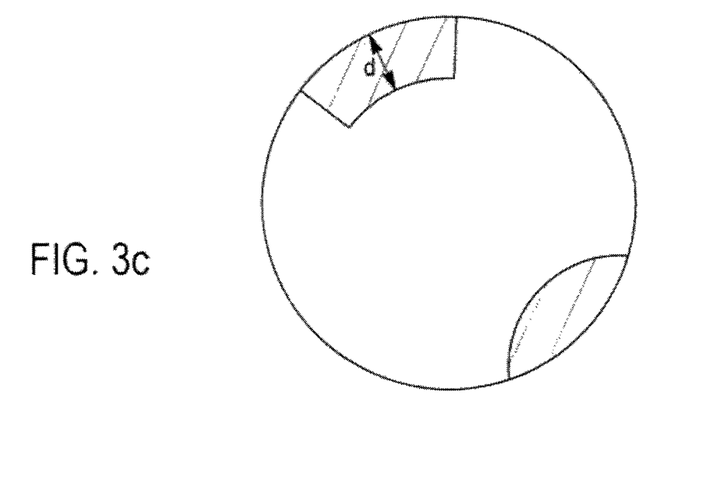

FIGS. 3a to 3c reproduce, on a view of the assembly surface of the first substrate 1 and of the carrier substrate 4, in the case where the latter are of circular shape, various configurations for application of the processing of the disclosure. In FIGS. 3a to 3c, the cross-hatched area represents the part of the peripheral region where the processing is applied.

The processing may thus be applied over a complete peripheral region, in other words around the whole contour of the assembly to be fractured 5, as is shown in FIG. 3a, or over only a part of this contour, in other words over a portion (FIG. 3b) or several portions (FIG. 3c) of the peripheral region.

Whether this processing is applied over a complete peripheral region or only over a part of the peripheral region, the strength of adhesion is preferably weakened over a radial length d greater than 1 micron starting from the edge of the assembly to be fractured. This radial length d is typically chosen to be between 100 microns and 500 microns.

Surprisingly, the inventors of the present application have observed that this weakening allowed the initiation and the propagation of the fracture wave along the embrittlement plane to be obtained using a reduced amount of thermal energy. In other words, the "threshold" thermal energy needed for the initiation of the fracture wave is reduced with respect to a method not comprising the processing according to the disclosure, but otherwise having identical characteristics.

The consequences of this observation are manifold.

Firstly, when, according to the disclosure, this processing for reduction of the degree of peripheral adhesion is applied, it is possible to obtain the initiation and the propagation of the wave at a fracture temperature lower than that of known thermal methods.

Moreover, since the fracture is thermally initiated, the drawbacks linked to the mechanical triggering of the fracture, which have previously been described, are not encountered.

Furthermore, when the initiation and the propagation of the fracture wave are obtained at a lower temperature, the useful layer 3 transferred onto the carrier substrate 4 exhibits a reduced non-uniformity.

Finally, the processing of the disclosure causes the initiation of the fracture wave, a fact which facilitates the industrial control of the process.

The processing for reducing the degree of peripheral adhesion may be obtained by exposing the assembly to be fractured 5 to a chemical agent capable of affecting the quality or the number of the bonds established around the periphery of the surfaces of the carrier substrate 4 and of the first substrate 1 during the assembly step.

This may be an etching agent applied to the assembly interface and capable of etching the material or materials forming these surfaces in contact, over at least a part of the outer edge.

It may also be a corrosive agent diffusing along the assembly interface and capable of breaking the bonds established between the surfaces in contact.

By limiting the exposure time of the assembly to be fractured to the etching and/or corrosive agent, it is ensured that the effect of reduction of the degree of adhesion really is limited to at least a part of a peripheral region of the surfaces in contact.

It may also be a step for mechanically impacting the assembly to be fractured 5 at the assembly interface, in such a manner as to weaken the strength of adhesion existing between the carrier substrate 4 and the first substrate 1 over at least a part of a peripheral region.

The observations that have just been made may be used to advantage, and the disclosure implemented, according to several embodiments.

According to a first embodiment, the thermal fracture treatment step is carried out by exposing the assembly to be fractured 5, in an oven, to an atmosphere heated to a fracture temperature. Then, the processing for reduction of the degree of peripheral adhesion is carried out, in this first embodiment, by introducing a chemical agent into the atmosphere of the oven.

This chemical agent will diffuse into the atmosphere of the oven and over a limited length of the assembly interface between the carrier substrate 4 and the first substrate 1 in order, for example, to etch the exposed surfaces and/or to break the bonds which had been formed there, and to reduce the degree of adhesion over a peripheral region between the carrier substrate 4 and the first substrate 1.

As has been previously seen, this processing facilitates the initiation and the propagation of the fracture wave.

Figure 4:
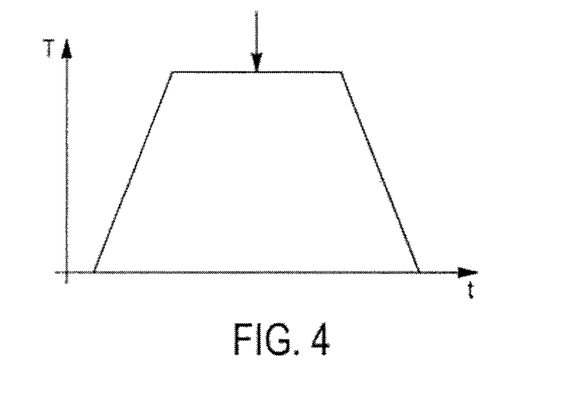
FIGS. 4 to 6 show the variation over time of the temperature of the thermal fracture treatment for various embodiments of the disclosure.

FIG. 4 shows, by way of example, the variation over time of the temperature of the thermal fracture treatment. The moment from which, in this example, the chemical agent is introduced into the atmosphere of the oven is shown in FIG. 4 by an arrow.

This moment can correspond to the start of the thermal fracture treatment.

However, the introduction of the chemical agent into the atmosphere of the oven may take place at a later time in the thermal fracture treatment, after an initial phase for embrittlement of the assembly to be fractured 5 (FIG. 2) or of a plurality of assemblies to be fractured 5 exposed to the atmosphere in the oven.

The introduction of the chemical agent leads to a reduction in the "threshold" level of thermal energy needed for the fracture, and thus causes the fracture in a controlled manner.

The initiation and the propagation of the fracture wave can be obtained at a relatively low temperature and the useful layer will consequently have an improved thickness uniformity.

On the other hand, if the temperature of the atmosphere in the oven is kept identical to the known thermal processes, it is then possible, according to the disclosure, to reduce the duration of the thermal fracture treatment.

Figure 5:
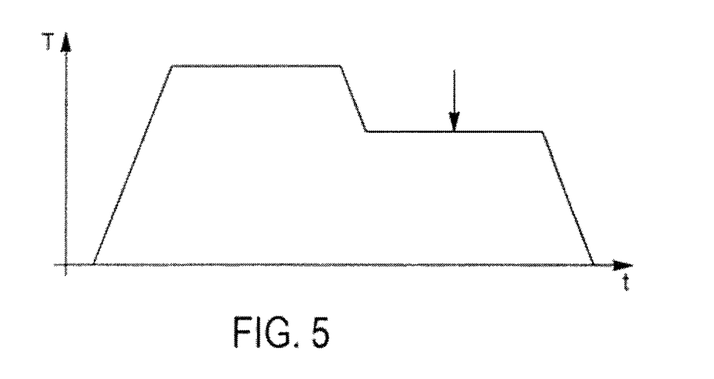

In one preferred variant of this first embodiment of the disclosure, shown in FIG. 5, the thermal fracture treatment comprises a first phase at a first temperature, the first phase not leading to the initiation of the fracture, and a second phase at a second temperature, lower than the first temperature, the processing for reduction of the degree of peripheral adhesion being applied during the second phase (indicated by the arrow in FIG. 5).

The term "temperature of a phase" denotes the average temperature applied during the phase in question, excluding the initial and final period of rise and of fall in temperature, if the latter are significant.

The first and/or the second phase can each be carried out in an atmosphere of an oven, as previously explained, and in this case, the temperature of the phase corresponds to the temperature of the atmosphere in the oven.

In this way, the disclosure allows a rapid embrittlement of the assembly to be fractured 5 during the first phase at a relatively high temperature (compared to the second temperature). The processing for reduction of the degree of adhesion is only applied during the second phase that follows, and leads to the fracture of the useful layer 3 at a lower temperature, which favors the uniformity of useful layer 3.

Figure 6:
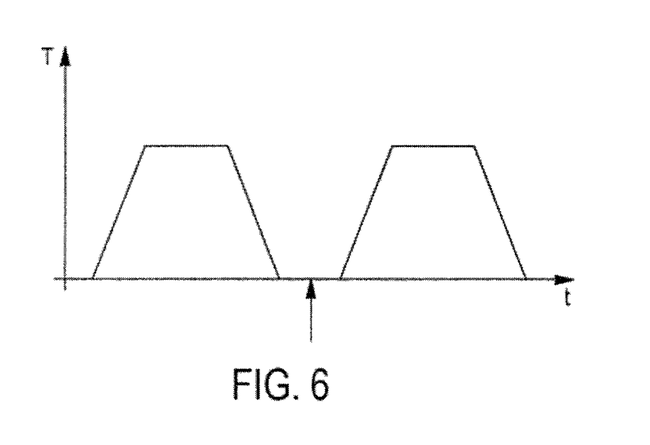

According to a second embodiment of the disclosure, shown in FIG. 6, the step for reducing the degree of peripheral adhesion is carried out at ambient temperature between a first phase of the thermal treatment during which the fracture does not occur and a second phase of the thermal treatment.

It is thus possible, by carrying out the processing for reduction of the degree of adhesion at ambient temperature, to use a wider variety of techniques.

According to such a first technique, similar to that which has been presented in the first embodiment, the weakening of the degree of adhesion in at least a part of a peripheral region between the carrier substrate 4 and the first substrate 1 is obtained by placing the assembly to be fractured 5 (FIG. 2) in a wet environment for a given period of time. "Wet environment" is understood to mean an environment having a level of humidity higher than 10%, 50% or even 60%. The duration of exposure may be 10 min, 30 min, 1 hour, 5 hours or even one day or more, for example, depending on the degree and the desired weakening. The environment may consist of an atmosphere or a liquid. The exposure of the assembly interface to this environment rich in water results in some bonds on the periphery, formed during the assembly step, being broken and, hence, the degree of adhesion being reduced.

According to another technique, the weakening is obtained by placing the assembly to be fractured 5 in an etching environment for a given period of time. The environment may consist of an atmosphere or a solution. The solution may be composed of or may comprise water and 10% HF. The exposure of the assembly interface to this environment leads to the etching, on the periphery, of the contact surfaces of the carrier substrate 4 and of the first substrate 1, hence, to reducing the degree of peripheral adhesion.

It may finally be envisaged to carry out the step for reducing the degree of adhesion by mechanical impact on the assembly to be fractured 5 at the assembly interface.

Comparative Example 1

A first substrate 1, consisting of a single-crystal silicon wafer of 300-mm diameter, is oxidized so as to form a fine layer of oxide of 25-nm thickness on the surface.

The first substrate 1 is implanted with hydrogen and helium in respective doses of 1e16 at/cm$^2$ and of 1e16 at/cm$^2$, and respective energies of 30 keV and 20 keV, in order to define the bounds of a useful layer 3.

This first substrate 1 and a carrier substrate 4, also composed of a single-crystal silicon wafer of 300-mm diameter, are assembled together by molecular adhesion in a conventional manner in order to form an assembly to be fractured 5.

The assembly to be fractured 5 is placed in an oven and annealed under an atmosphere of nitrogen for 3 hours. The atmosphere of nitrogen is at a temperature of 350° C.

During the annealing, the fracture is spontaneously initiated in the oven and the useful layer 3 of silicon of 200-nm thickness is transferred onto the carrier substrate 4, in order to form a silicon-on-insulator substrate.

The surface of the carrier substrate 4 is analyzed and exhibits a thickness variation whose maximum amplitude is 0.4 nm.

Comparative Example 2

A batch consisting of twenty-five assemblies to be fractured 5, all identical to that of Example 1, is placed in an oven.

The thermal treatment of the Comparative Example 1 has been reproduced by changing only the temperature of the atmosphere in the oven, heated to 300° C. After 4 hours of annealing, it is observed that the fracture has not been initiated for any of the assemblies to be fractured.

Example 1

A batch composed of twenty-five assemblies to be fractured 5, all identical to that of Example 1, is placed in an oven, in an atmosphere of nitrogen, having a temperature of 350° C., for 2 hours.

After the annealing, the fracture has not been initiated and the batch is removed from the oven and placed at ambient temperature in a wet atmosphere (45% humidity) for 1 hour.

The batch is subsequently placed in the oven at 250° C. for 2 hours. After the annealing, it is observed that all the wafers have spontaneously fractured.

Furthermore, the surface states of the useful layers 3 are analyzed and exhibit thickness variations whose maximum amplitude over a wafer is less than 0.2 nm.

Example 2

The experiment in Example 2 is reproduced, but between the two annealing steps, the assemblies to be fractured 5 are exposed to a chemical attack of the wafer edge with a solution composed of water and of HF diluted to 10%, instead of the processing in the wet atmosphere.

The measurements performed on the useful layers 3 are identical to those in Example 1.

Example 3

A batch of substrates to be fractured 5 is prepared in a similar manner to the two preceding examples, and placed in an oven under an inert atmosphere at 350° C. for 2 hours.

Without interrupting this annealing process, the temperature is subsequently reduced to 250° C. and the annealing continued for two hours at this temperature. At the start of this phase at 250° C., water in the form of steam is injected into the atmosphere of the oven.

After the annealing, it is observed that all the wafers have been fractured. The measurements of mean thicknesses and of non-uniformities performed on the useful layers 3 are identical to that of the Example 1 or Example 2.

It goes without saying that the disclosure is not limited to the embodiments described and variant embodiments may be devised without straying from the scope of the invention such as defined by the claims.

What is claimed is:

1. A method for transferring a useful layer onto a carrier substrate, comprising:
   formation of an embrittlement plane by implantation of light species into a first substrate, the embrittlement plane and a surface of the first substrate defining one or more boundaries of a useful layer therebetween;
   mounting of the carrier substrate onto the surface of the first substrate so as to form an assembly to be fractured; and
   exposing the assembly to be fractured to an atmosphere in an oven and performing thermal fracture treatment of the first substrate along the embrittlement plane to transfer the useful layer onto the carrier substrate, and during the thermal fracture treatment of the first substrate, processing the assembly to be fractured so as to reduce a degree of adhesion at most over a peripheral region of an interface between the carrier substrate and the first substrate;
   Wherein the thermal fracture treatment of the first substrate comprises exposing the assembly to be fractured in the atmosphere of the oven to a temperature higher than 350° C.

2. The method of claim 1, wherein the first substrate and the carrier substrate comprise silicon.

3. The method of claim 1, wherein the thermal fracture treatment of the first substrate further comprises:
   a first phase at a first temperature, the first phase not leading to initiation of a fracture;
   and a second phase at a second temperature lower than the first temperature;
   and wherein the processing of the assembly to be fractured so as to reduce the degree of peripheral adhesion at the interface is applied during the second phase.

4. The method of claim 1, wherein the processing of the assembly to be fractured so as to reduce the degree of peripheral adhesion at the interface comprises introduction of water into the atmosphere of the oven.

5. The method of claim 1, wherein the thermal fracture treatment of the first substrate further comprises:
   a first phase at a first temperature, the first phase not leading to initiation of the fracture; and a second phase at a second temperature; and
   wherein the processing of the assembly to be fractured so as to reduce the degree of peripheral adhesion at the interface is applied at ambient temperature and between the first phase and the second phase.

6. The method of claim 5, wherein the second temperature is lower than the first temperature.

7. The method of claim 5, wherein the processing of the assembly to be fractured so as to reduce the degree of peripheral adhesion at the interface comprises exposing the assembly to be fractured to a humid environment having a humidity for a period of time.

8. The method of claim 7, wherein the first substrate and the carrier substrate comprise silicon, the humid environment comprises the atmosphere, the humidity is at least 10% and the period of time is at least 15 minutes.

9. The method of claim 5, wherein the processing of the assembly to be fractured so as to reduce the degree of peripheral adhesion at the interface comprises exposing the assembly to be fractured to an etching environment.

10. The method of claim 9, wherein the etching environment comprises a solution of water and HF.

11. The method of claim 1, wherein the implanted light species comprise at least one of hydrogen ions or helium ions.

12. The method of claim 1, wherein the processing of the assembly to be fractured so as to reduce the degree of peripheral adhesion at the interface is applied between the carrier substrate and the first substrate over a radial distance greater than 1 micron starting from an edge of the assembly to be fractured.

13. The method of claim 12, wherein the radial distance is in a range extending from 100 microns to 500 microns.

14. A method for transferring a useful layer onto a carrier substrate, comprising:
   implanting ionic species into a first substrate so as to form an embrittlement plane within the first substrate and define a useful layer to be transferred onto a carrier substrate between the embrittlement plane and a surface of the first substrate;
   mounting the carrier substrate onto the surface of the first substrate so as to form an assembly to be fractured; and
   thermally treating the assembly to be fractured at a first temperature in a first thermal treatment phase so as to increase a bond strength between the first substrate and the carrier substrate without generating a fracture along the embrittlement plane;
   and thermally treating the assembly to be fractured at a second temperature in a second thermal treatment phase and generating a fracture along the embrittlement plane;
   wherein the method further comprises weakening a bond strength between the first substrate and the carrier substrate at a peripheral region of an interface between the first substrate and the carrier substrate after thermally treating the assembly to be fractured at the first temperature in the first thermal treatment phase and prior to generating the fracture along the embrittlement plane.

15. The method of claim 14, wherein weakening the bond strength between the first substrate and the carrier substrate at the peripheral region of the interface comprises increasing a humidity of an environment in which the assembly to be fractured is disposed.

16. The method of claim 15, wherein generating the fracture along the embrittlement plane comprises generating the fracture at a temperature below the first temperature.

17. The method of claim 14, wherein weakening the bond strength between the first substrate and the carrier substrate at the peripheral region of the interface comprises introducing an etchant into an environment in which the assembly to be fractured is disposed.

18. The method of claim 17, wherein generating the fracture along the embrittlement plane comprises generating the fracture at a temperature below the first temperature.

* * * * *